US010003352B2

United States Patent
Li et al.

(10) Patent No.: US 10,003,352 B2
(45) Date of Patent: Jun. 19, 2018

(54) HIGH-PRECISION ANALOG-TO-DIGITAL CONVERTER AND DNL-BASED PERFORMANCE IMPROVEMENT METHOD

(71) Applicant: China Electronic Technology Corporation, 24th Research Institute, Chongqing (CN)

(72) Inventors: Ting Li, Chongqing (CN); Gangyi Hu, Chongqing (CN); Hequan Jiang, Chongqing (CN); Ruzhang Li, Chongqing (CN); Zhengbo Huang, Chongqing (CN); Yong Zhang, Chongqing (CN); Guangbing Chen, Chongqing (CN); Yuxin Wang, Chongqing (CN); Dongbing Fu, Chongqing (CN)

(73) Assignee: CHINA ELECTRONIC TECHNOLOGY CORPORATION, 24TH RESEARCH INSTITUTE, Chongqing (CN)

( * ) Notice: Subject to any disclaimer, the term of this patent is extended or adjusted under 35 U.S.C. 154(b) by 0 days. days.

(21) Appl. No.: 15/559,055

(22) PCT Filed: Jun. 8, 2015

(86) PCT No.: PCT/CN2015/079438
§ 371 (c)(1),
(2) Date: Sep. 17, 2017

(87) PCT Pub. No.: WO2016/183836
PCT Pub. Date: Nov. 24, 2016

(65) Prior Publication Data
US 2018/0076824 A1    Mar. 15, 2018

(30) Foreign Application Priority Data

May 20, 2015  (CN) .......................... 2015 1 0258874

(51) Int. Cl.
*H03M 1/12* (2006.01)
*H03M 1/46* (2006.01)
(Continued)

(52) U.S. Cl.
CPC ......... *H03M 1/468* (2013.01); *H03M 1/0678* (2013.01); *H03M 1/1061* (2013.01);
(Continued)

(58) Field of Classification Search
CPC .. H03M 1/468; H03M 1/0678; H03M 1/1245; H03M 1/42; H03M 1/804
(Continued)

(56) References Cited

U.S. PATENT DOCUMENTS 4,517,549 A * 5/1985 Tsukakoshi ............. H03M 1/40
341/156
7,812,757 B1 * 10/2010 Wong .................... H03M 1/468
341/155
(Continued)

FOREIGN PATENT DOCUMENTS

CN    102045067 A    5/2011
CN    102801422 A    11/2012
(Continued)

*Primary Examiner* — Brian Young
(74) *Attorney, Agent, or Firm* — Cheng-Ju Chiang

(57) ABSTRACT

The present invention provides a high-precision analog-to-digital converter, includes a redundant weight capacitor array, a comparator, a code reestablishment circuit, a weight storage circuit and a control logic circuit. The redundant weight capacitor array collects input voltages and generates output voltages in a sampling stage. The comparator compares the output voltages of the redundant weight capacitor array. The code reestablishment circuit calculates an output code of the successive approximation type analog-to-digital converter according to the comparator output result and a capacitor weight in the weight storage circuit. The weight
(Continued)

storage circuit stores the capacitor weight. The control logic circuit controls the sampling and conversion stages of the redundant weight capacitor array. The present invention also provides a DNL-based performance improvement method adapted to the analog-to-digital converter.

14 Claims, 4 Drawing Sheets

(51) Int. Cl.
    *H03M 1/80*      (2006.01)
    *H03M 1/42*      (2006.01)
    *H03M 1/10*      (2006.01)
    *H03M 1/06*      (2006.01)

(52) U.S. Cl.
    CPC ........... *H03M 1/1245* (2013.01); *H03M 1/42* (2013.01); *H03M 1/804* (2013.01)

(58) Field of Classification Search
    USPC .................................................. 341/155, 161
    See application file for complete search history.

(56) References Cited

U.S. PATENT DOCUMENTS 8,842,027 B2*   9/2014   Huang ................ H03M 1/1057
                                                                                         341/120
2010/0259432 A1    10/2010   Ishikawa

FOREIGN PATENT DOCUMENTS

CN        103166644 A     6/2013
CN        103281083 A     9/2013
CN        103929178 A     7/2014

* cited by examiner

HIGH-PRECISION ANALOG-TO-DIGITAL CONVERTER AND DNL-BASED PERFORMANCE IMPROVEMENT METHOD

BACKGROUND OF THE INVENTION

Technical Field

The present invention belongs to the technical field of analog-to-digital converters, and in particular to a high-precision analog-to-digital converter and a DNL-based performance improvement method.

Description of Related Art

A successive approximation type analog-to-digital (A/D) converter typically comprises a comparator, a capacitor array, a successive approximation register and a control logic circuit, with most of these circuit modules being digital circuits; and therefore, with the reduction of a technological dimension, the successive approximation type A/D converter starts to demonstrate an innate structural advantage thereof, where the digital circuit is not only faster in speed and lower in power consumption, but also smaller in area along with the reduction of the technological dimension, and this is in line with the requirements for low power consumption and miniaturization of a modern electronic product. Of course, an analog circuit therein also faces the problem of gain reduction and power consumption increase brought by the reduction of the technological dimension, but the advantage outweighs its disadvantage from a comprehensive view. Therefore, a successive approximation type structure becomes an international research hotspot in recent years.

The research on the successive approximation type A/D converter at present mainly focuses on the low-medium precision, and the research on the high precision is relatively scant, with the reason that a mismatch error of a capacitor array results in the linearity reduction and signal to noise ratio reduction of a high-precision successive type A/D converter due to the presence of a process variation, therefore, the mismatch error of the capacitor array becomes a key limiting factor restricting the performance of the high-precision successive type A/D converter. Based on studies, the inventor of the present invention has found that when a traditional capacitor array mismatch error measurement and correction method for the successive approximation type A/D converter is applied to the high-precision successive approximation type A/D converter, there are the following problems.

1. Structural Problem:

In a successive approximation type A/D converter of a traditional structure, if a digital correction method is adopted to record an actual weight of each capacitor, a code missing phenomenon may occur when a high bit weight is more than a sum of all the residual bit weights plus 1LSB (Least Significant Bit), even though the actual weight of each capacitor can be measured correctly. For example, a 4-bit A/D converter has an actual weight of (9, 3, 2, 1), with an input output corresponding relation as follows:

| Input  | 0 | 1 | 2 | 3 | 4 | 5 | 6 | 7 | 8 | 9 | 10 | 11 | 12 | 13 | 14 | 15 |
|--------|---|---|---|---|---|---|---|---|---|---|----|----|----|----|----|----|
| Output | 0 | 1 | 2 | 3 | 4 | 5 | 6 | 6 | 6 | 9 | 10 | 11 | 12 | 13 | 14 | 15 |

It follows that 7 and 8 in an output code are missing. Therefore, for the successive approximation type A/D converter of the traditional structure, the digital method cannot be used for correcting the capacitor mismatch error.

2. Problem on Mismatch Error Measurement:

For the traditional measurement of the capacitor mismatch error, a small capacitor array is typically introduced for assistance, meanwhile, a corresponding control switch and a corresponding control logic circuit are required, which not only increases the complexity of a circuit design but also results in the measurement precision reduction of the capacitor mismatch error since the introduced small capacitor array likewise has a capacitor mismatch error, and it is very difficult to meet the requirement on measurement precision during application to the high-precision successive approximation type A/D converter.

3. Problem on Capacitor Mismatch Error Correction:

With the traditional correction method for the capacitor mismatch error, a compensating capacitor array is typically used to compensate the capacitor mismatch error; when a certain capacitor participates in an addition and subtraction operation of a charge, a corresponding compensating capacitor array compensates a charge change caused by the mismatch error thereof; since the compensation precision must be within 1LSB, the compensating capacitor array must employ a complex structure to implement high compensation precision when the precision of the successive approximation type A/D converter increases, therefore, it is very difficult to implement the compensating capacitor array.

BRIEF SUMMARY OF THE INVENTION

Specific to the technical problems existing in the prior art, the present invention provides a high-precision successive approximation type analog-to-digital converter, which effectively reduces the complexity of a circuit design and may accurately measure a capacitor mismatch error and perform capacitor mismatch error correction without an auxiliary capacitor array, an auxiliary switch and a control logic, thereby achieving the object of promoting the signal to noise ratio, linearity and conversion speed of the A/D converter.

To achieve the object as described above, a technical solution employed by the present invention is as follows:

A high-precision analog-to-digital converter, characterized by comprising a redundant weight capacitor array, a comparator, a code reestablishment circuit, a weight storage circuit and a control logic circuit; wherein the redundant weight capacitor array receives external input voltages Vin+ and Vin−, generates output voltages Vout+ and Vout− under the control of the control logic circuit, supplies the output voltages Vout+ and Vout− to the comparator for comparison, and controls each bit of capacitor to participate in a voltage addition and subtraction operation in sequence under the control of the control logic circuit according to a comparison result of the comparator to regenerate output voltages Vout+ and Vout− which are supplied to the comparator for comparison, repeating as such until a last bit of capacitor completes the voltage addition and subtraction operation, and the redundant weight capacitor array is combined with the weight storage circuit to implement digital correction of a capacitor mismatch error, thereby preventing code missing for the analog-to-digital converter;

the comparator compares the output voltages Vout+ and Vout− of the redundant weight capacitor array, outputs 1 if Vout+ is more than Vout−, or else, outputs 0;

the code reestablishment circuit calculates an output code of the successive approximation type analog-to-digital converter according to an output result of the comparator and an actual capacitor weight extracted according to DNL in the weight storage circuit;

the weight storage circuit stores the actual capacitor weight extracted according to DNL; and the control logic circuit controls the redundant weight capacitor array to collect the input voltages in a sampling stage and controls a corresponding weight capacitor of the redundant weight capacitor array to implement the voltage addition and subtraction operation according to the output result of the comparator in a conversion stage.

The high-precision analog-to-digital converter provided by the present invention employs a capacitor array with redundant weights to enable the digital correction of a capacitor mismatch error, and with the use of the redundant weight, an error brought by the incomplete establishment of the capacitor array can be withstood, thereby promoting the conversion speed of the analog-to-digital converter; and with the measurement of the capacitor mismatch error in the present invention, the capacitor mismatch error can be measured without the auxiliary capacitor array, the auxiliary switch and the control logic, thereby reducing the complexity of the circuit design, and saving layout area and power consumption, meanwhile, with a digital method in the present invention for measuring and correcting the capacitor mismatch, the error measurement and correction precision is not limited by a technological condition, thereby improving the measurement and correction precision, and the signal to noise ratio and linearity of the analog-to-digital converter are improved by measuring and correcting the capacitor mismatch error.

Further, the redundant weight capacitor array comprises n bits of effective capacitors (corresponding to n effective weights) and at least r bits of redundant capacitors (corresponding to r redundant weights), and the number of capacitors included in each bit of the effective capacitor and redundant capacitor is an integral multiple of 2, wherein an $n^{th}$ bit of effective capacitor is $C_n$, an $(n-1)^{th}$ bit of effective capacitor is $C_{n-1}$, ..., a first bit of effective capacitor is $C_1$, $C_n$ is a highest weight effective capacitor with the weight of $W_n$, $C_1$ is a lowest weight effective capacitor with the weight of $W_1$; and an $r^{th}$ bit of redundant capacitor is $C'_r$, an $(r-1)^{th}$ bit of redundant capacitor is $C'_{r-1}$ ..., a first bit of redundant capacitor is $C'_1$, C'r is a highest weight redundant capacitor with the weight of $W'_r$, $C'_1$ is a lowest weight redundant capacitor with the weight of $W'_1$, the redundant weight capacitor array may comprise one or more bits of redundant capacitors from $C'_r$, ..., $C'_1$ for analog-to-digital conversion, and at least one bit of redundant capacitor is present at each redundant weight.

Further, the redundant capacitors are located behind the effective capacitors having the same weight as the redundant capacitors.

Further, a maximum capacitor mismatch error determined by a process and a circuit structure is $N_{mismatch\_max}$ LSB, and a minimum redundant weight number required by the redundant weight capacitor array is $N_{r\_min}=1+\log_2(N_{mismatch\_max})$.

Further, the redundant weight capacitor array and the comparator simultaneously employ a differential structure for connection or simultaneously employ a single-end structure for connection.

The present invention also provides a DNL-based performance improvement method, the method being adapted to the foregoing high-precision successive approximation type analog-to-digital converter, comprising the following steps:

Receiving external input voltages Vin+ and Vin− for sampling, generating output voltages Vout+ and Vout− after sampling and supplying the output voltages Vout+ and Vout− to a comparator for comparison, by a redundant weight capacitor array;

comparing the output voltages Vout+ and Vout− by the comparator to obtain a comparison output result;

controlling a corresponding weight capacitor of the redundant weight capacitor array according to the comparison output result to perform a voltage addition and subtraction operation, regenerating output voltages Vout+ and Vout− and supplying the output voltages Vout+ and Vout− to the comparator for comparison, by a control logic circuit, repeating as such until a lowest weight bit of capacitor completes the voltage addition and subtraction operation, and implementing digital correction for a capacitor mismatch error by the redundant weight capacitor array in combination with a weight storage circuit to prevent code missing for the analog-to-digital converter; and storing each comparison output result, reading an actual capacitor weight extracted according to DNL in the weight storage circuit and calculating an output code of the successive approximation type analog-to-digital converter, by a code reestablishment circuit.

The DNL-based performance improvement method adapted to the foregoing high-precision successive approximation type analog-to-digital converter provided by the present invention employs a capacitor array with redundant weights to enable the digital correction of the capacitor mismatch error, and with the use of the redundant weight, an error brought by the incomplete establishment of the capacitor array can be withstood, thereby promoting the conversion speed of the analog-to-digital converter; and with the measurement of the capacitor mismatch error in the present invention, the capacitor mismatch error can be measured without the auxiliary capacitor array, the auxiliary switch and the control logic, thereby reducing the complexity of the circuit design, and saving layout area and power consumption, meanwhile, with a digital method in the present invention for measuring and correcting the capacitor mismatch, the error measurement and correction precision is not limited by a technological condition, thereby improving the measurement and correction precision, and the signal to noise ratio and linearity of the analog-to-digital converter are improved by measuring and correcting the capacitor mismatch error.

Further, after the redundant weight capacitor array performs sampling, the output voltage Vout+ is equal to βVin+, the output voltage Vout− is equal to βVin−, and the comparator compares a first output of the output voltages Vout+ and Vout− to obtain a comparison output result $D_n$; the control logic circuit controls an effective capacitor $C_n$ to perform the voltage addition and subtraction operation according to the comparison output result $D_n$ to obtain a second output of Vout+ and Vout−; and the comparator compares the a second output of the output voltages Vout+ and Vout− to obtain a comparison output result $D_{n-1}$, repeating as such until a lowest weight bit of capacitor completes the voltage addition and subtraction operation.

Further, if the comparison output result $D_n$ is 1, an output voltage of the $n^{th}$ effective capacitor after operation is $$[(V_{out+}) - (V_{out-})]_n = [(V_{out+}) - (V_{out-})]_0 - \beta \times Vref \times \frac{W_n}{\sum_{k=i+1}^{n} W_k};$$

if the comparison output result $D_n$ is 0, an output voltage of the $n^{th}$ effective capacitor after operation is $$[(V_{out+}) - (V_{out-})]_n = [(V_{out+}) - (V_{out-})]_0 - \beta \times Vref \times \frac{W_n}{\sum_{k=i+1}^{n} W_k};$$

and $C_n, C_{n-1}, \ldots, C_r, C'_r, C_{r-1}, C'_{r-1}, \ldots, C_1, C'_1$ sequentially perform the voltage addition and subtraction operation in turn, wherein $\beta$ is a ratio of a sum of sampling capacitors to a sum of all the capacitors, i.e., $$\beta = \frac{\sum_{k=i+1}^{n} W_k}{\sum_{k=1}^{n} C_k + \sum_{k=1}^{r} C'_k}.$$

Further, the code reestablishment circuit calculates the output code of the successive approximation type analog-to-digital converter with a formula as follows:

$$D_{out} = W_n D_n + W_{n-1} D_{n-1} + \ldots + W_r D_r + W'_r D'_r + \ldots + W_1 D_1 + W'_1 D'_1,$$

wherein $W_n, W_{n-1}, \ldots, W_r, W'_r, \ldots, W_1, W'_1$ are capacitor weights stored in the weight storage circuit, and $D_n, D_{n-1}, \ldots, D_r, D'_r, \ldots, D_1, D'_1$ are comparison output results of the comparator.

Further, the extracting of the actual capacitor weight extracted according to DNL, stored in the weight storage circuit, comprises the following steps:

Setting a capacitor weight initial value in the weight storage circuit as an ideal weight;

turning off all the redundant capacitors and then performing A/D conversion to obtain a first output sequence code of the code reestablishment circuit;

calculating a first DNL sequence of the analog-to-digital converter according to the first output sequence code;

extracting actual weights of effective capacitors according to the first DNL sequence;

turning off the effective capacitors corresponding to all the redundant capacitors and then performing A/D conversion to obtain a second output sequence code of the code reestablishment circuit;

calculating a second DNL sequence of the analog-to-digital converter according to the second output sequence code; and extracting actual weights of the redundant capacitors according to the second DNL sequence.

Further, the setting a capacitor weight initial value in the weight storage circuit as an ideal weight specifically comprises:

Setting a significant bit weight, with a $j^{th}$ significant bit weight $W_j = 2^{j-1}$, wherein $j = 1, 2, \ldots, n$; and setting a redundant bit weight, with a $k^{th}$ redundant bit weight $W'_k = W_k = 2^{k-1}$, wherein $k = 1, 2, \ldots, r$.

Further, the extracting actual weights of effective capacitors according to the first DNL sequence specifically comprises the following steps:

restoring according to the first DNL sequence to obtain an input output relation of the analog-to-digital converter as follows:

$$A_m(x) = \sum_{j=1}^{x} A(j) = x + \sum_{j=1}^{x} DNL(j),$$

wherein $A_{in}(x)$ is an analog input voltage increment corresponding to a digital code $x$;

extracting a weight of an $n^{th}$ effective capacitor as follows:

$$W_n = \frac{1}{2^{n-1} - 2 \times N_e(n)} \left[ \sum_{j=2^{n-1}+N_e(n)}^{2^n - N_e(n)} A_{in}(j) - \sum_{j=N_e(n)}^{2^{n-1}-N_e(n)} A_{in}(j) \right],$$

wherein $N_e(n)$ is a number of rejection points determined by process mismatch; assuming a maximum mismatch determined by a process variation is $e$ %, $N_e(n)$ is a rounded product of $2^n \ast e$ % in the calculation of an $n^{th}$ bit of capacitor weight, i.e. $N_e(n) = \text{int}(2n \times e \%)$;

extracting a weight $W_{n-1}$ of an $(n-1)^{th}$ bit of effective capacitor as follows:

$$W_{(n-1)_1} = \frac{1}{2^{n-2} - 2 \times N_e(n-1)} \left[ \sum_{j=2^{n-2}+N_e(n-1)}^{2^{n-1} - N_e(n-1)} A_{in}(j) - \sum_{j=N_e(n-1)}^{2^{n-2}-N_e(n-1)} A_{in}(j) \right]$$

$$W_{(n-1)_2} = \frac{1}{2^{n-2} - 2 \times N_e(n-1)} \left[ \sum_{j=2^{n-2}+N_e(n-1)+2^{n-1}}^{2^{n-1} - N_e(n-1)+2^{n-1}} A_{in}(j) - \sum_{j=N_e(n-1)+2^{n-1}}^{2^{n-2}-N_e(n-1)+2^{n-1}} A_{in}(j) \right]$$

$$W_{(n-1)} = \frac{1}{2} [W_{(n-1)_1} + W_{(n-1)_2}],$$

wherein $N_e(n-1) = \text{int}(2n^{-1} \times e \%)$; and extracting a weight $W_m$ of an $m^{th}$ bit of effective capacitor as follows:

$$W_{m_1} = \frac{1}{2^{m-1} - 2 \times N_e(m)} \left[ \sum_{j=2^{m-1}+N_e(m)}^{2^m - N_e(m)} A_{in}(j) - \sum_{j=N_e(m)}^{2^{m-1}-N_e(m)} A_{in}(j) \right]$$

$$W_{m_2} = \frac{1}{2^{m-1} - 2 \times N_e(m)} \left[ \sum_{j=2^{m-1}+N_e(m)+2^m}^{2^m - N_e(m)+2^m} A_{in}(j) - \sum_{j=N_e(m)+2^m}^{2^{m-1}-N_e(m)+2^m} A_{in}(j) \right]$$

$$\ldots$$

$$W_{m_{(2^{n-m})}} = \frac{1}{2^{m-1} - 2 \times N_e(m)}$$

$$\left[ \sum_{j=2^{m-1}+N_e(m)+(2^{n-m}-1)\times 2^m}^{2^m - N_e(m)+(2^{n-m}-1)\times 2^m} A_{in}(j) - \sum_{j=N_e(m)+(2^{n-m}-1)\times 2^m}^{2^{m-1}-N_e(m)+(2^{n-m}-1)\times 2^m} A_{in}(j) \right]$$

$$W_m = \frac{1}{2^{n-m}} \sum_{j=1}^{2^{n-m}} W_{mj};$$

repeating as such to extract all capacitor weights remained after the $m^{th}$ capacitor;

if the capacitor weights of the capacitors after the $m^{th}$ capacitor as determined by the process variation have no effect on the monotonicity of the capacitor array, a mismatch error of a capacitor with the weight of less than $W_m$ is negligible, and the weight of the capacitor is an ideal weight.

Further, the extracting actual weights of the redundant capacitors according to the second DNL sequence specifically comprises the following steps:

Restoring according to the second DNL sequence to obtain an input output relation of the analog-to-digital converter as follows:

$$A'_{in}(x) = \sum_{j=1}^{x} A'(j) = x + \sum_{j=1}^{x} DNL'(j),$$

wherein $A'_{in}(x)$ is an analog input voltage increment corresponding to a digital code x;

extracting a weight $W_{r'}$ of an $r'^{th}$ redundant capacitor as follows:

$$W_{r'_1} = \frac{1}{2^{r'-1} - 2 \times N_e(r')} \left[ \sum_{j=2^{r'-1}+N_e(r')}^{2^{r'}-N_e(r')} A_{in}(j) - \sum_{j=N_e(r')}^{2^{r'-1}-N_e(r')} A_{in}(j) \right]$$

$$W_{r'_2} = \frac{1}{2^{r'-1} - 2 \times N_e(r')} \left[ \sum_{j=2^{r'-1}+N_e(r')+2^{r'}}^{2^{r'}-N_e(r')+2^{r'}} A_{in}(j) - \sum_{j=N_e(r')+2^{r'}}^{2^{r'-1}-N_e(r')+2^{r'}} A_{in}(j) \right]$$

...

$$W_{r'_{(2^{n-r'})}} = \frac{1}{2^{r'-1} - 2 \times N_e(r')}$$

$$\left[ \sum_{j=2^{r'-1}+N_e(r')+(2^{n-r'}-1) \times 2^{r'}}^{2^{r'}-N_e(r')+(2^{n-r'}-1) \times 2^{r'}} A_{in}(j) - \sum_{j=N_e(r')+(2^{n-r'}-1) \times 2^{r'}}^{2^{r'-1}-N_e(r')+(2^{n-r'}-1) \times 2^{r'}} A_{in}(j) \right]$$

$$W_{r'} = \frac{1}{2^{n-r'}} \sum_{j=1}^{2^{n-r}} W_{r'_j};$$

repeating as such to extract all capacitor weights remained after the $r'^{th}$ capacitor;

if the capacitor weights of the capacitors after the $m'^{th}$ capacitor as determined by the process variation have no effect on the monotonicity of the capacitor array, a mismatch error of a capacitor with the weight of less than $W_{m'}$ is negligible, and the weight of the capacitor is an ideal weight.

Further, the method further comprises the following steps:

Writing the extracted actual weight into the weight storage circuit;

turning on all the effective capacitors and redundant capacitors to enable the same to participate in the A/D conversion; and performing the A/D conversion and obtaining a correct output code by using the actual weights.

Figure 1:
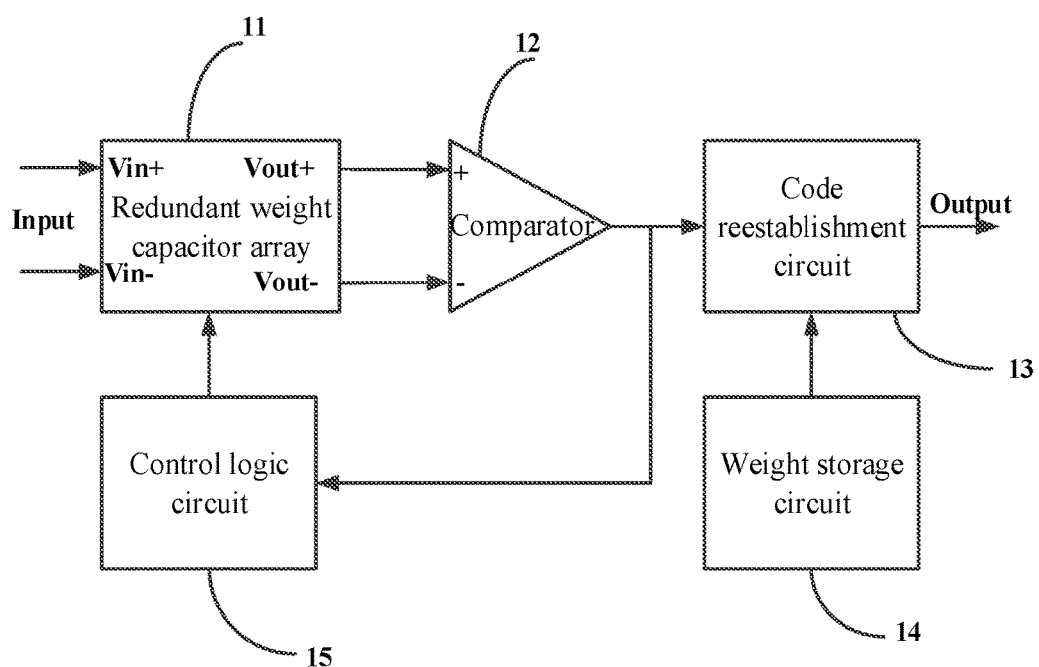
FIG. 1 is a block diagram of a structure of a high-precision analog-to-digital converter provided by the present invention.

In the drawings, reference signs are as follows: 11, redundant weight capacitor array; 12, comparator; 13, code reestablishment circuit; 14, weight storage circuit; and 15, control logic circuit.

DETAILED DESCRIPTION OF THE INVENTION

For a better understanding of the implemented technical means, inventive features, and achieved objects and effects of the present invention, the present invention will be further illustrated below in combination with specific drawings.

As is shown by referring to FIG. 1, the present invention provides a high-precision analog-to-digital converter, comprising a redundant weight capacitor array 11, a comparator 12, a code reestablishment circuit 13, a weight storage circuit 14 and a control logic circuit 15; wherein the redundant weight capacitor array 11 receives external input voltages Vin+ and Vin−, generates output voltages Vout+ and Vout− under the control of the control logic circuit 15, supplies the output voltages Vout+ and Vout− to the comparator 12 for comparison, and controls each bit of capacitor to participate in a voltage addition and subtraction operation in sequence under the control of the control logic circuit 15 according to a comparison result of the comparator 12 to regenerate output voltages Vout+ and Vout− which are supplied to the comparator 12 for comparison, repeating as such until a last bit of capacitor completes the addition and subtraction operation, and the redundant weight capacitor array is combined with the weight storage circuit to implement digital correction of a capacitor mismatch error, thereby preventing code missing for the analog-to-digital converter;

the comparator 12 compares the output voltages Vout+ and Vout− of the redundant weight capacitor array 11, outputs 1 if Vout+ is more than Vout−, or else, outputs 0;

the code reestablishment circuit 13 calculates an output code of the successive approximation type analog-to-digital converter according to an output result of the comparator 12 and an actual capacitor weight extracted according to DNL in the weight storage circuit 14;

the weight storage circuit 14 stores the actual capacitor weight extracted according to DNL; and the control logic circuit 15 controls the redundant weight capacitor array 11 to collect the input voltages in a sampling stage and controls a corresponding weight capacitor of the redundant weight capacitor array 11 to implement the voltage addition and subtraction operation according to the output result of the comparator 12 in a conversion stage.

The high-precision analog-to-digital converter provided by the present invention employs a capacitor array with redundant weights to enable the digital correction of a capacitor mismatch error, and with the use of the redundant weight, an error brought by the incomplete establishment of the capacitor array can be withstood, thereby promoting the conversion speed of the analog-to-digital converter; and with the measurement of the capacitor mismatch error in the present invention, the capacitor mismatch error can be measured without the auxiliary capacitor array, the auxiliary switch and the control logic, thereby reducing the complexity of the circuit design, and saving layout area and power consumption, meanwhile, with a digital method in the present invention for measuring and correcting the capacitor mismatch, the error measurement and correction precision is not limited by a technological condition, thereby improving the measurement and correction precision, and the signal to noise ratio and linearity of the analog-to-digital converter are improved by measuring and correcting the capacitor mismatch error.

The high-precision analog-to-digital converter provided by the present invention has a working principle specifically as follows: External input voltages Vin+ and Vin− are supplied to the redundant weight capacitor array, which samples input voltages Vin+ and Vin−, generates output voltages Vout+ and Vout− and supplies the output voltages Vout+ and Vout− to the comparator for comparison, the redundant weight capacitor array is controlled in sequence according to a comparator output result to regenerate output voltages Vout+ and Vout− and supply the output voltages Vout+ and Vout− to the comparator for comparison, repeating as such until a lowest weight bit capacitor completes a voltage addition and subtraction operation, the redundant weight capacitor array is combined with the weight storage circuit to enable digital correction for the capacitor mismatch error, thereby preventing code missing for the analog-to-digital converter; and meanwhile, each output result of the comparator is sent to the code reestablishment circuit, which reestablishes a code according to the comparator output result and an actual capacitor weight information extracted according to DNL, read from the weight storage circuit, to finally obtain an output of the analog-to-digital converter.

Figure 2:
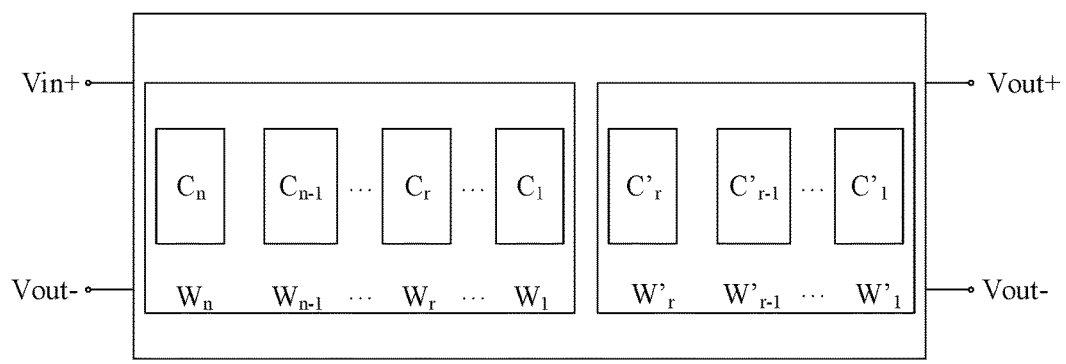
FIG. 2 is a schematic diagram of a structure of a redundant weight capacitor array in FIG. 1.

As a particular embodiment, as is shown by referring to FIG. 2, the redundant weight capacitor array includes n bits of effective capacitors (corresponding to n effective weights) and at least r bits of redundant capacitors (corresponding to r redundant weights), and the number of capacitors included in each bit of the effective capacitor and redundant capacitor is an integral multiple of 2, wherein an $n^{th}$ bit of effective capacitor is $C_n$, an $(n-1)^{th}$ bit of effective capacitor is $C_{n-1}$, ..., a first bit of effective capacitor is $C_1$, $C_n$, is a highest weight effective capacitor with the weight of $W_n$, and $C_1$ is a lowest weight effective capacitor with the weight of $W_1$; an $r^{th}$ bit of redundant capacitor is $C'_r$, an $(r-1)^{th}$ bit of redundant capacitor is $C'_{r-1}$, ..., a first bit of redundant capacitor is $C'_1$, $C'_r$ is a highest weight redundant capacitor with the weight of $W'_r$, $C'_1$ is a lowest weight redundant capacitor with the weight of $W'_1$, the redundant weight capacitor array may comprise one or more bits of redundant capacitors from $C'_r$, ..., $C'_1$ for analog-to-digital conversion, that is, the redundant weight capacitor array may select p bits of redundant capacitors from the at least r bits of redundant capacitor for analog-to-digital conversion, and when the redundant weight capacitor array comprises all the capacitors of $C'_r$, ..., $C'_1$, p is more than or equal to r, or else, p is less than r; moreover, at least one bit of redundant capacitor is present at each redundant weight, and in a structure of the redundant weight capacitor array as shown in FIG. 2, one bit of the redundant capacitor is present at each redundant weight. However, the redundant capacitor of each redundant weight is not limited to be one bit and may also be designed as required, two or more bits of redundant capacitors are set in one redundant weight, i.e., two or more redundant capacitors of the same weight are set in one redundant weight, for example, two bits of first $C'_r$ redundant capacitor and second $C'_r$ redundant capacitor with the same weight can be set in the redundant weight with the weight of $W'_r$; and when two bits of first $C'_r$ redundant capacitor and second $C'_r$ redundant capacitor with the same weight can be set in the redundant weight with the weight of $W'_r$, the redundant weight capacitor array comprises r+1 bits of redundant capacitors.

As a particular embodiment, the at least r bits of redundant capacitor $C'_r$, ..., $C'_1$ in the redundant weight capacitor array may not participate in an analog-to-digital conversion process, i.e. a voltage addition and subtraction operation, under the control of the control logic circuit. The effective capacitors $C_r$, ..., $C_1$ corresponding to r bits of redundant capacitor may also not participate in the analog-to-digital process under the control of the control logic circuit. But the effective capacitors and the redundant capacitors may not participate in the analog-to-digital process simultaneously. That is, at each weight, at least one of the effective capacitor and the redundant capacitor needs to participate in the analog-to-digital process. When two or more bits of redundant capacitors of the same weight are set at some redundant weights, one bit of redundant capacitor at a certain redundant weight may be selected at first to participate in the analog-to-digital conversion in a capacitor weight extraction process, and after one capacitor weight extraction period is completed, one bit of residual redundant capacitor is selected from two or more bits of redundant capacitors with the same weight for capacitor weight extraction until the extraction of all the capacitor weights is completed. Meanwhile, in the redundant weight capacitor array provided by the present invention, the redundant capacitor is located behind the effective capacitor of the same weight, thereby possibly guaranteeing that the conversion process is performed in a descending order of the capacitor weights to enable the digital correction of the weight error.

As a particular embodiment, the weight storage circuit 14 is used for storing an actual capacitor weight extracted according to DNL, an $n^{th}$ bit of effective capacitor $C_n$ has a weight of $W_n$, an $(n-1)^{th}$ bit of effective capacitor $C_{n-1}$ has a weight of $W_{n-1}$, ..., a first bit of effective capacitor $C_1$ has a weight of $W_1$; and an $r^{th}$ bit of redundant capacitor $C'_r$ has a weight of $W'_r$, an $(r-1)^{th}$ bit of redundant capacitor $C'_{r-1}$ has a weight of $W'_{r-1}$, ..., a first redundant capacitor $C'_1$ has a weight of $W'_1$.

As a particular embodiment, in the redundant weight capacitor array provided by the present invention, the number of the least redundant weight as required is determined by a maximum capacitor mismatching determined by a process. If a maximum capacitor mismatch error determined by a process and a circuit structure is $N_{mismatch\_max}$ LSB, a minimum redundant weight number required by the redundant weight capacitor array is $N_{r\_min}=1+\log_2(N_{mismatch\_max})$.

As a particular embodiment, the redundant weight capacitor array and the comparator simultaneously employ a differential structure for connection or simultaneously employ a single-end structure for connection, thereby enabling structure consistency between the redundant weight capacitor array and the comparator. Specifically, the redundant weight capacitor array and the comparator simultaneously employing a differential structure for connection or simultaneously employing a single-end structure for connection specifically refers to that if the differential structure is employed, a differential manner is used for connection, with the capacitor array for differential output and the comparator for differential input; and if the single-end structure is employed, the single-end manner is used for connection, with the capacitor array for single-end output and the comparator for single-end input.

As a particular embodiment, the specific circuit structures of the control logic circuit, weight storage circuit and code reestablishment circuit in the present invention can be implemented with the existing circuit structure.

The present invention also provides a DNL-based performance improvement method, the method being adapted to the foregoing high-precision successive approximation type analog-to-digital converter, comprising the following steps:

Receiving external input voltages Vin+ and Vin− for sampling, generating output voltages Vout+ and Vout− after sampling and supplying the output voltages Vout+ and Vout− to a comparator for comparison, by a redundant weight capacitor array;

comparing the output voltages Vout+ and Vout− by the comparator to obtain a comparison output result;

controlling a corresponding weight capacitor of the redundant weight capacitor array according to the comparison output result to perform a voltage addition and subtraction operation, regenerating output voltages Vout+ and Vout− and supplying the output voltages Vout+ and Vout− to the comparator for comparison, by a control logic circuit, repeating as such until a lowest weight bit of capacitor completes the voltage addition and subtraction operation, and implementing digital correction for a capacitor mismatch error by the redundant weight capacitor array in combination with a weight storage circuit to prevent code missing for the analog-to-digital converter; and storing each comparison output result, reading an actual capacitor weight extracted according to DNL in the weight storage circuit and calculating an output code of the successive approximation type analog-to-digital converter, by a code reestablishment circuit.

The DNL-based performance improvement method adapted to the foregoing high-precision successive approximation type analog-to-digital converter provided by the present invention employs a capacitor array with redundant weights to enable the digital correction of the capacitor mismatch error, and with the use of the redundant weight, an error brought by the incomplete establishment of the capacitor array can be withstood, thereby promoting the conversion speed of the analog-to-digital converter; and with the measurement of the capacitor mismatch error in the present invention, the capacitor mismatch error can be measured without the auxiliary capacitor array, the auxiliary switch and the control logic, thereby reducing the complexity of the circuit design, and saving layout area and power consumption, meanwhile, with a digital method in the present invention for measuring and correcting the capacitor mismatch, the error measurement and correction precision is not limited by a technological condition, thereby improving the measurement and correction precision, and the signal to noise ratio and linearity of the analog-to-digital converter are improved by measuring and correcting the capacitor mismatch error.

As a particular embodiment, in a sampling stage, the effective capacitor in the redundant weight capacitor array collects the input voltages, the effective capacitors $C_n$, $C_{n-1}$, ..., $C_1$ may partially or completely participate in the sampling, in case of partial participation in the sampling, all the capacitors from the $i^{th}$ bit to the lowest bit do not participate in the sampling, where i is more than or equal to 1; and after the redundant weight capacitor array performs the sampling, the output voltage Vout+ is equal to $\beta$Vin+, the output voltage Vout− is equal to $\beta$Vin−, and before all the capacitors participate in the voltage addition and subtraction operation, the input voltage of the comparator is as follows: $[(V_{out+})-(V_{out-})]_0 = [(V_{in+})-(V_{in-})]$. In a conversion stage, the control logic circuit controls a corresponding weight capacitor of the redundant weight capacitor array to implement the voltage addition and subtraction operation according to the comparator output result, at first, the comparator compares a first output of the output voltages Vout+ and Vout− to obtain a comparison output result $D_n$; the control logic circuit controls an effective capacitor $C_n$ to perform the voltage addition and subtraction operation according to the comparison output result $D_n$ to obtain a second output of Vout+ and Vout−, i.e. to obtain the output voltage $[(V_{out+})-(V_{out-})]_n$ after the operation of the $n^{th}$ effective capacitor; and the comparator compares the second output of the output voltages Vout+ and Vout− to obtain a comparison output result $D_{n-1}$, repeating as such until a lowest weight bit of capacitor completes the voltage addition and subtraction operation.

As a preferred embodiment, if the comparison output result $D_n$ is 1, it indicates that the output voltage Vout+ is more than the output voltage Vout−, the control logic circuit needs to control a capacitor $C_n$ corresponding to an $n^{th}$ weight in the redundant weight capacitor array, and if a voltage of the weight corresponding to $C_n$ is subtracted from a previous output voltage, an output voltage of the $n^{th}$ bit of effective capacitor $C_n$ after the current operation is:

$$[(V_{out+})-(V_{out-})]_n = [(V_{out+})-(V_{out-})]_0 - \beta \times Vref \times \frac{W_n}{\sum_{k=i+1}^{n} W_k};$$

if the comparison output result $D_n$ is 0, it indicates that the output voltage Vout+ is less than the output voltage Vout−, the control logic circuit needs to control a capacitor $C_n$ corresponding to an $n^{th}$ weight in the redundant weight capacitor array, and if a voltage of the weight corresponding to $C_n$ is added to a previous output voltage, an output voltage of the $n^{th}$ bit of effective capacitor $C_n$ after the current operation is:

$$[(V_{out+})-(V_{out-})]_n = [(V_{out+})-(V_{out-})]_0 - \beta \times Vref \times \frac{W_n}{\sum_{k=i+1}^{n} W_k},$$

wherein $\beta$ is a ratio of a sum of sampling capacitors and a sum of all the capacitors, i.e.

$$\beta = \frac{\sum_{k=i+1}^{n} W_k}{\sum_{k=1}^{n} C_k + \sum_{k=1}^{r} C'_k}.$$

Based on the method above, $C_n$, $C_{n-1}$, ..., $C_r$, $C'_r$, $C'_{r-1}$, $C'_{r-1}$, ..., $C_1$, $C'_1$ sequentially perform the voltage addition and subtraction operation in turn. Specifically, if the comparison output result $D_j$ is 1, it indicates that the output voltage Vout+ is more than the output voltage Vout−, the control logic circuit needs to control a capacitor $C_j$ corresponding to a $j^{th}$ weight in the redundant weight capacitor array, and if a voltage of the weight corresponding to $C_j$ is subtracted from a previous output voltage, for example, when a previous operating capacitor is a capacitor $C_{j+1}$ corresponding to a $(j+1)^{th}$ weight, an output voltage of $C_j$ after the current operation is $$[(V_{out+}) - (V_{out-})]_j = [(V_{out+}) - (V_{out-})]_{j+1} - \beta \times Vref \times \frac{W_j}{\sum_{k=i+1}^{n} W_k},$$

wherein j=1, 2, . . . , n−1; if the comparison output result $D_j$ is 0, it indicates that the output voltage Vout+ is less than the output voltage Vout−, the control logic circuit needs to control a capacitor $C_j$ corresponding to a $j^{th}$ weight in the redundant weight capacitor array, and if a voltage of the weight corresponding to $C_j$ is added to a previous output voltage, for example, when a previous operating capacitor is a capacitor $C_{j+1}$ corresponding to a $(j+1)^{th}$ weight, an output voltage of $C_j$ after the current operation is $$[(V_{out+}) - (V_{out-})]_j = [(V_{out+}) - (V_{out-})]_{j+1} + \beta \times Vref \times \frac{W_j}{\sum_{n}^{} W},$$

wherein j=1, 2, . . . , n−1, repeating as such until a lowest weight bit capacitor completes the voltage addition and subtraction operation.

As a particular embodiment, the code reestablishment circuit calculates an output code of the successive approximation type analog-to-digital converter according to an output result of the comparator and a capacitor weight in the weight storage circuit, with the steps as follows:

Reading output results $D_n$, $D_{n-1}$, . . . , $D_r$, $D'_r$, $D_{r-1}$, $D'_{r-1}$, . . . , $D_1$, $D'_1$ of the comparator;

reading capacitor weights $W_n$, $W_{n-1}$, . . . , $W_r$, $W'_r$, $W_{r-1}$, $W'_{r-1}$, . . . , $W_1$, $W'_1$ in the weight storage circuit; and calculating an output code, i.e. adding all the output results of the comparator in terms of weight as follows: $D_{out}=W_nD_n+W_{n-1}D_{n-1}+ \ldots +W_rD_r+W'_rD'_r+ \ldots +W_1D_1+W'_1D'_1$.

Figure 3:
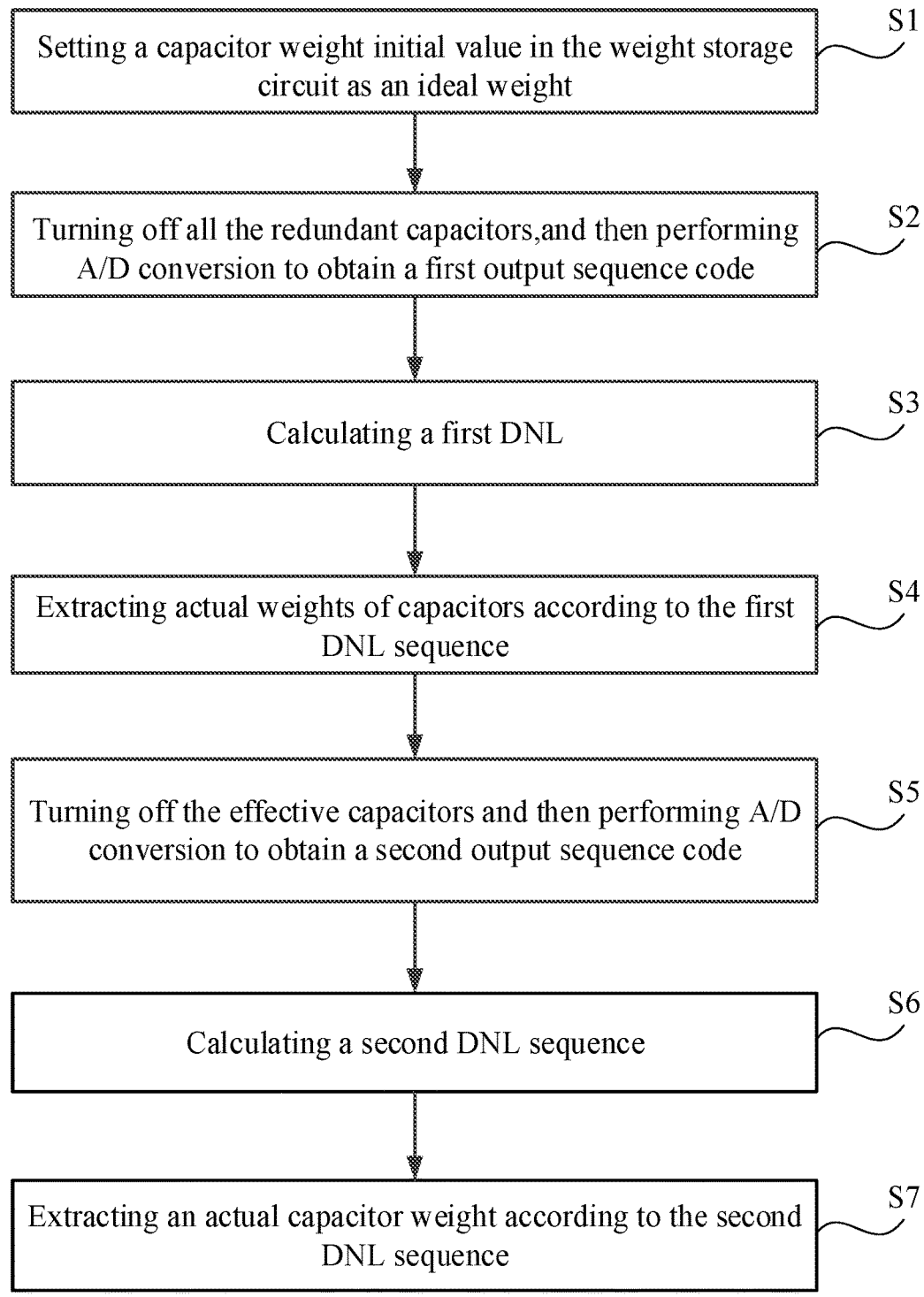
FIG. 3 is a schematic diagram of a flow of extracting an actual capacitor weight of an analog-to-digital converter based on DNL provided by the present invention.

Due to the presence of the capacitor mismatch in a technological processing process, the actual weight of the capacitor is not equal to the ideal weight thereof, resulting in the reduction of the performance of the analog-to-digital converter, therefore, it is necessary to extract the actual capacitor weight and promote the signal to noise ratio and linearity of the analog-to-digital conversion by using the actual weight. Therefore, as a particular embodiment, as is shown by referring to FIG. 3, the extracting of the actual capacitor weight extracted according to DNL, stored in the weight storage circuit comprises the following steps:

S1, setting a capacitor weight initial value in the weight storage circuit as an ideal weight, specifically comprising the following settings:

setting a significant bit weight, with a $j^{th}$ significant bit weight $W_j=2^{j-1}$, wherein j=1, 2, . . . , n and setting a redundant bit weight, with a $k^{th}$ redundant bit weight $W'_k=W_k=2^{k-1}$, wherein k=1, 2, . . . , r.

S2, turning off all the redundant capacitors so that they do not participate in the analog-to-digital conversion, and then performing analog-to-digital (A/D) conversion according to the set ideal weight value to obtain a first output sequence code of the code reestablishment circuit;

S3, calculating a first DNL (Differential Nonlinear Error) of the analog-to-digital converter according to the first output sequence code, where a universal calculation method (for example a code density method) in the industry may be used as a specific method for calculating the first DNL sequence, and the detailed description thereof will be omitted herein;

S4, extracting actual weights of capacitors according to the first DNL sequence to obtain the actual weight of the effective capacitor, with the specific steps as follows:

S41, restoring according to the first DNL sequence to obtain an input output relation of the analog-to-digital converter as follows:

Assuming that the analog-to-digital converter outputs a DNL corresponding to a digital code 1 as DNL(1), outputs a DNL corresponding to a digital code 2 as DNL(2), . . . , outputs a DNL corresponding to a digital code x as DNL(x), an analog step height corresponding to an $x^{th}$ digital code jump may be obtained according to the DNL as follows: A(x)=DNL(x)+1, that is, an analog input needs to be added by A(1)=DNL(1)+1LSB for a first output code jump (from 0 to 1), an analog input needs to be added by A(2)=DNL(2)+1LSB for a second output code jump (from 1 to 2), . . . , an analog input needs to be added by A(x)=DNL(x)+1LSB for an $x^{th}$ output code jump (from x−1 to x), . . . , and an analog input needs to be added by $A(2^n-1)=DNL(2^n-1)+1LSB$ for a $(2^n-1)^{th}$ output code jump (from $2^n-1$ to $2^n-1$). As such, it is possible to further obtain the input output relation of the analog-to-digital converter as follows:

$$A_{in}(x) = \sum_{j=1}^{x} A(j) = x + \sum_{j=1}^{x} DNL(j),$$

wherein $A_{in}(x)$ is an analog-to-digital input voltage increment corresponding to a digital code x.

S42, extracting a weight $W_n$ of an $n^{th}$ bit of effective capacitor $C_n$:

The capacitor $C_n$ is a most significant bit capacitor, with a weight of $$W_n = \frac{1}{2^{n-1} - 2 \times N_e(n)} \left[ \sum_{j=2^{n-1}+N_e(n)}^{2^n - N_e(n)} A_{in}(j) - \sum_{j=N_e(n)}^{2^{n-1}-N_e(n)} A_{in}(j) \right]$$

wherein $N_e(n)$ is a number of rejection points determined by process mismatch; assuming a maximum mismatch determined by a process variation is e %, $N_e(n)$ is a rounded product of $2^n \ast$ e % in the calculation of an $n^{th}$ bit of capacitor weight, i.e. $N_e(n)=int(2^n \times e \%)$;

S43, extracting a weight $W_{n-1}$ of an $(n-1)^{th}$ bit of effective capacitor $C_{n-1}$ as follows:

The capacitor $C_{n-1}$ is a sub-most significant bit capacitor, with a capacitor weight $W_{(n-1)}$ calculated as follows:

$$W_{(n-1)_1} = \frac{1}{2^{n-2} - 2 \times N_e(n-1)} \left[ \sum_{j=2^{n-2}+N_e(n-1)}^{2^{n-1}-N_e(n-1)} A_{in}(j) - \sum_{j=N_e(n-1)}^{2^{n-2}-N_e(n-1)} A_{in}(j) \right]$$

$$W_{(n-1)_2} =$$
$$\frac{1}{2^{n-2} - 2 \times N_e(n-1)} \left[ \sum_{j=2^{n-2}+N_e(n-1)+2^{n-1}}^{2^{n-1}-N_e(n-1)+2^{n-1}} A_{in}(j) - \sum_{j=N_e(n-1)+2^{n-1}}^{2^{n-2}-N_e(n-1)+2^{n-1}} A_{in}(j) \right]$$

$$W_{(n-1)} = \frac{1}{2}[W_{(n-1)_1} + W_{(n-1)_2}],$$

wherein $N_e(n-1)=int(2^{n-1} \times e \%)$.

S44, extracting a weight $W_m$ of an $m^{th}$ bit of effective capacitor as follows:

$$W_{m_1} = \frac{1}{2^{m-1} - 2 \times N_e(m)} \left[ \sum_{j=2^{m-1}+N_e(m)}^{2^m - N_e(m)} A_{in}(j) - \sum_{j=N_e(m)}^{2^{m-1} - N_e(m)} A_{in}(j) \right]$$

$$W_{m_2} = \frac{1}{2^{m-1} - 2 \times N_e(m)} \left[ \sum_{j=2^{m-1}+N_e(m)+2^m}^{2^m - N_e(m)+2^m} A_{in}(j) - \sum_{j=N_e(m)+2^m}^{2^{m-1} - N_e(m)+2^m} A_{in}(j) \right]$$

...

$$W_{m_{(2^{n-m})}} = \frac{1}{2^{m-1} - 2 \times N_e(m)} \left[ \sum_{j=2^{m-1}+N_e(m)+(2^{n-m}-1)\times 2^m}^{2^m - N_e(m)+(2^{n-m}-1)\times 2^m} A_{in}(j) - \sum_{j=N_e(m)+(2^{n-m}-1)\times 2^m}^{2^{m-1} - N_e(m)+(2^{n-m}-1)\times 2^m} A_{in}(j) \right]$$

$$W_m = \frac{1}{2^{n-m}} \sum_{j=1}^{2^{n-m}} W_{mj};$$

S45, repeating as such to extract all capacitor weights remained after the $m^{th}$ capacitor;

if the capacitor weights of the capacitors after the $m^{th}$ capacitor as determined by the process variation have no effect on the monotonicity of the capacitor array, a mismatch error of a capacitor with the weight of less than $W_m$ is negligible, and the weight of the capacitor is an ideal weight.

S5, turning off the effective capacitors corresponding to all the redundant capacitors so that they do not participate in the A/D conversion and then performing A/D conversion to obtain a second output sequence code of the code reestablishment circuit;

S6, calculating a second DNL sequence of the analog-to-digital converter according to the second output sequence code; and S7, extracting an actual capacitor weight according to the second DNL sequence to obtain an actual weight of the redundant capacitor, where the method is the same as that for extracting the effective capacitor weight, specifically comprising the following steps:

S71, restoring according to the second DNL sequence to obtain an input output relation of the analog-to-digital converter as follows:

Assuming that the analog-to-digital converter outputs a DNL corresponding to a digital code 1 as DNL'(1), outputs a DNL corresponding to a digital code 2 as DNL'(2), . . . , outputs a DNL corresponding to a digital code x as DNL'(x), an analog step height corresponding to an $x^{th}$ digital code jump may be obtained according to the DNL as follows: A'(x)=DNL'(x)+1, that is an analog input needs to be added by A'(1)=DNL'(1)+1LSB for a first output code jump (from 0 to 1), an analog input needs to be added by A'(2)=DNL'(2)+1LSB for a second output code jump (from 1 to 2), . . . , an analog input needs to be added by A'(x)=DNL'(x)+1LSB for an $x^{th}$ output code jump (from x-1 to x), . . . , and an analog input needs to be added by A'($2^n$-1)=DNL'($2^n$-1)+1LSB for a ($2^n$-1)$^{th}$ output code jump (from $2^n$-2 to $2^n$-1). As such, it is possible to further obtain the input output relation of the analog-to-digital converter as follows:

$$A'_{in}(x) = \sum_{j=1}^{x} A'(j) = x + \sum_{j=1}^{x} DNL'(j),$$

wherein $A'_{in}(x)$ is an analog input voltage increment corresponding to a digital code x.

S72, extracting a weight $W_{r'}$ of an $r'^{th}$ redundant capacitor as follows:

$$W_{r'_1} = \frac{1}{2^{r'-1} - 2 \times N_e(r')} \left[ \sum_{j=2^{r'-1}+N_e(r')}^{2^{r'} - N_e(r')} A_{in}(j) - \sum_{j=N_e(r')}^{2^{r'-1} - N_e(r')} A_{in}(j) \right]$$

$$W_{r'_2} = \frac{1}{2^{r'-1} - 2 \times N_e(r')} \left[ \sum_{j=2^{r'-1}+N_e(r')+2^{r'}}^{2^{r'} - N_e(r')+2^{r'}} A_{in}(j) - \sum_{j=N_e(r')+2^{r'}}^{2^{r'-1} - N_e(r')+2^{r'}} A_{in}(j) \right]$$

...

$$W_{r'_{(2^{n-r'})}} = \frac{1}{2^{r'-1} - 2 \times N_e(r')} \left[ \sum_{j=2^{r'-1}+N_e(r')+(2^{n-r'}-1)\times 2^{r'}}^{2^{r'} - N_e(r')+(2^{n-r'}-1)\times 2^{r'}} A_{in}(j) - \sum_{j=N_e(r')+(2^{n-r'}-1)\times 2^{r'}}^{2^{r'-1} - N_e(r')+(2^{n-r'}-1)\times 2^{r'}} A_{in}(j) \right]$$

$$W_{r'} = \frac{1}{2^{n-r'}} \sum_{j=1}^{2^{n-r'}} W_{r'_j};$$

S73, repeating as such to extract all capacitor weights remained after the $r'^{th}$ capacitor;

and if the capacitor weights of the capacitors after the $m^{th}$ capacitor as determined by the process variation have no effect on the monotonicity of the capacitor array, a mismatch error of a capacitor with the weight of less than $W_{m'}$ is negligible, and the weight of the capacitor is an ideal weight.

As a preferred embodiment, when two or more bits of redundant capacitors of the same weight are set in some redundant weights, one bit of redundant capacitor in a certain redundant weight may be selected at first to participate in the analog-to-digital conversion in a capacitor weight extraction process, and after one capacitor weight extraction period is completed, one bit of residual redundant capacitor is selected from two or more bits of redundant capacitors with the same weight for capacitor weight extraction until the extraction of all the capacitor weights is completed.

Figure 4:
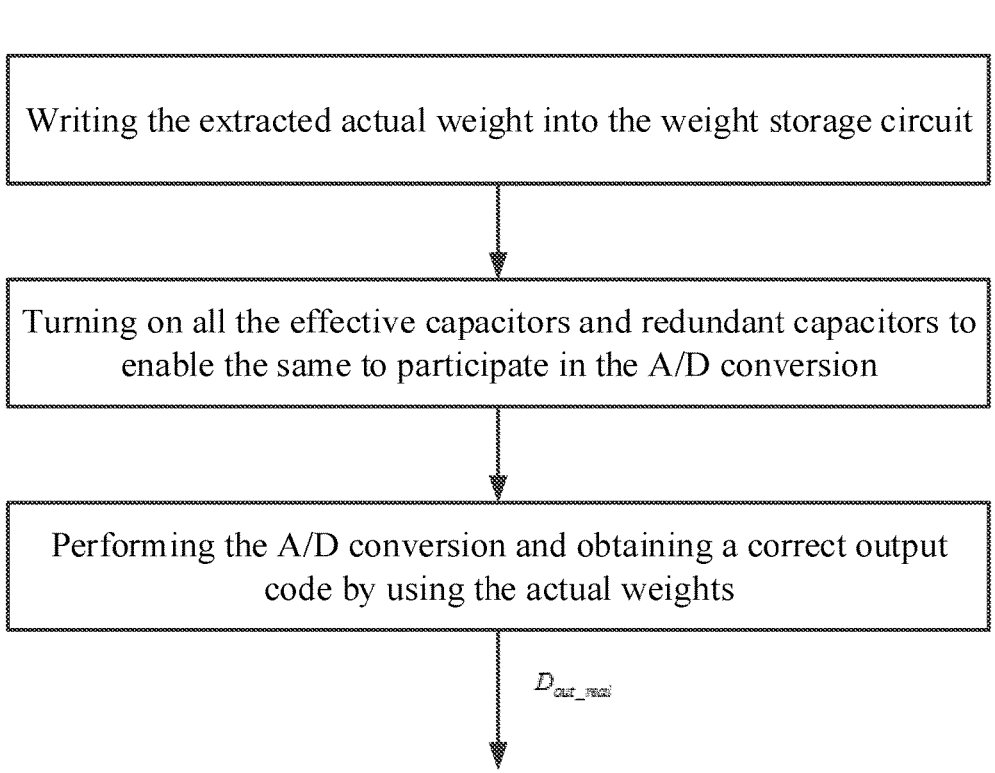
FIG. 4 is a schematic diagram of a flow of performance improvement of the analog-to-digital converter based on DNL provided by the present invention.

As a particular embodiment, as is shown by referring to FIG. 4, the extracted actual capacitor weight is used to improve the performance of the analog-to-digital conversion, which further comprises the following steps:

Writing the extracted actual weight into the weight storage circuit;

turning on all the effective capacitors and redundant capacitors to enable the same to participate in the A/D conversion; and performing the A/D conversion and obtaining a correct output code by using the actual weights.

The foregoing merely provides the embodiments of the present invention, but is not intended to thereby limit the patent scope of the present invention. Any equivalent structures made by utilizing the specification and accompanying drawings of the present invention and applied to other relevant technical fields directly or indirectly likewise fall under the scope of patent protection of the present invention.

What is claimed is:

1. A high-precision analog-to-digital converter, comprising a redundant weight capacitor array, a comparator, a code reestablishment circuit, a weight storage circuit and a control logic circuit; wherein the redundant weight capacitor array receives external input voltages Vin+ and Vin−, generates output voltages Vout+ and Vout− under the control of the control logic circuit, supplies the output voltages Vout+ and Vout− to the comparator for comparison, and controls each bit of capacitor to participate in a voltage addition and subtraction operation in sequence under the control of the control logic circuit according to a comparison result of the comparator to regenerate output voltages Vout+ and Vout− which are supplied to the comparator for comparison, repeating as such until a last bit of capacitor completes the voltage addition and subtraction operation, and the redundant weight capacitor array is combined with the weight storage circuit to implement digital correction of a capacitor mismatch error, thereby preventing code missing for the analog-to-digital converter;

the comparator compares the output voltages Vout+ and Vout− of the redundant weight capacitor array, outputs 1 if Vout+ is more than Vout−, or else, outputs 0;

the code reestablishment circuit calculates an output code of the successive approximation type analog-to-digital converter according to an output result of the comparator and an actual capacitor weight extracted according to DNL in the weight storage circuit;

the weight storage circuit stores the actual capacitor weight extracted according to DNL; and the control logic circuit controls the redundant weight capacitor array to collect the input voltages in a sampling stage and controls a corresponding weight capacitor of the redundant weight capacitor array to implement the voltage addition and subtraction operation according to the output result of the comparator in a conversion stage.

2. The high-precision analog-to-digital converter according to claim 1, wherein the redundant weight capacitor array comprises n bits of effective capacitors and at least r bits of redundant capacitors, and the number of capacitors included in each bit of the effective capacitor and redundant capacitor is an integral multiple of 2, wherein an $n^{th}$ bit of effective capacitor is $C_n$, an $(n-1)^{th}$ bit of effective capacitor is $C_{n-1}$, ..., a first bit of effective capacitor is $C_1$, $C_n$ is a highest weight effective capacitor with the weight of $W_n$, $C_1$ is the lowest weight effective capacitor with the weight of $W_1$; and an $r^{th}$ bit of redundant capacitor is $C'_r$, an $(r-1)^{th}$ bit of redundant capacitor is $C'_{r-1}$, ..., a first bit of redundant capacitor is $C'_1$, $C'_r$ is a highest weight redundant capacitor with the weight of $W'_r$, $C'_1$ is a lowest weight redundant capacitor with the weight of $W'_1$, the redundant weight capacitor array may comprise one or more bits of redundant capacitors from $C'_r$, ..., $C'_1$ for analog-to-digital conversion, and at least one bit of redundant capacitor is present at each redundant weight.

3. The high-precision analog-to-digital converter according to claim 2, wherein the redundant capacitors are located behind the effective capacitors having the same weight as the redundant capacitors.

4. The high-precision analog-to-digital converter according to claim 2, wherein a maximum capacitor mismatch error determined by a process and a circuit structure is $N_{mismatch\_max}$ LSB, and a minimum redundant weight number required by the redundant weight capacitor array is $N_{r\_min}=1+\log_2(N_{mismatch\_max})$.

5. The high-precision analog-to-digital converter according to claim 1, wherein the redundant weight capacitor array and the comparator simultaneously employ a differential structure for connection or simultaneously employ a single-end structure for connection.

6. A DNL-based performance improvement method, the method being adapted to a high-precision analog-to-digital converter, comprising the following steps:

receiving external input voltages Vin+ and Vin− for sampling, generating output voltages Vout+ and Vout− after sampling and supplying the output voltages Vout+ and Vout− to a comparator for comparison, by a redundant weight capacitor array;

comparing the output voltages Vout+ and Vout− by the comparator to obtain a comparison output result;

controlling a corresponding weight capacitor of the redundant weight capacitor array according to the comparison output result to perform a voltage addition and subtraction operation, regenerating output voltages Vout+ and Vout− and supplying the output voltages Vout+ and Vout− to the comparator for comparison, by a control logic circuit, repeating as such until a lowest weight bit of capacitor completes the voltage addition and subtraction operation, and implementing digital correction for a capacitor mismatch error by the redundant weight capacitor array in combination with a weight storage circuit to prevent code missing for the analog-to-digital converter; and storing each comparison output result, reading an actual capacitor weight extracted according to DNL in the weight storage circuit and calculating an output code of the successive approximation type analog-to-digital converter, by a code reestablishment circuit.

7. The DNL-based performance improvement method according to claim 6, wherein after the redundant weight capacitor array performs sampling, the output voltage Vout+ is equal to βVin+, the output voltage Vout− is equal to βVin−, and the comparator compares a first output of the output voltages Vout+ and Vout− to obtain a comparison output result $D_n$; the control logic circuit controls an effective capacitor $C_n$ to perform the voltage addition and subtraction operation according to the comparison output result $D_n$ to obtain a second output of Vout+ and Vout−; and the comparator compares the second output of the output voltages Vout+ and Vout− to obtain a comparison output result $D_{n-1}$, repeating as such until a lowest weight bit of capacitor completes the voltage addition and subtraction operation.

8. The DNL-based performance improvement method according to claim 7, wherein if the comparison output result $D_n$ is 1, an output voltage of an $n^{th}$ effective capacitor after operation is:

$$[(V_{out+})-(V_{out-})]_n = [(V_{out+})-(V_{out-})]_0 - \beta \times Vref \times \frac{W_n}{\sum_{k=i+1}^{n} W_k};$$

if the comparison output result $D_n$ is 0, an output voltage of the $n^{th}$ effective capacitor after operation is:

$$[(V_{out+})-(V_{out-})]_n = [(V_{out+})-(V_{out-})]_0 - \beta \times Vref \times \frac{W_n}{\sum_{k=i+1}^{n} W_k};$$

and $C_n, C_{n-1}, \ldots, C_r, C'_r, C_{r-1}, C'_{r-1}, \ldots, C_1, C'_1$ sequentially perform the voltage addition and subtraction operation in turn, wherein β is a ratio of a sum of sampling capacitors to a sum of all the capacitors;

$$\beta = \frac{\sum_{k=i+1}^{n} W_K}{\sum_{k=1}^{n} C_k + \sum_{k=1}^{r} C'_k}.$$

9. The DNL-based performance improvement method according to claim 6, wherein the code reestablishment circuit calculates the output code of the successive approximation type analog-to-digital converter with a formula as follows:

$$D_{out} = W_n D_n + W_{n-1} D_{n-1} + \ldots + W_r D_r + W'_r D'_r + \ldots + W_1 D_1 + W'_1 D'_1$$

wherein $W_n, W_{n-1}, \ldots, W_r, W'_r, \ldots, W_1, W'_1$ are capacitor weights stored in the weight storage circuit, and $D_n, D_{n-1}, \ldots, D_r, D'_r, D_1, D'_1$ are comparison output results of the comparator.

10. The DNL-based performance improvement method according to claim 6, wherein extraction of the actual capacitor weight extracted according to DNL, stored in the weight storage circuit, comprises the following steps:
setting a capacitor weight initial value in the weight storage circuit as an ideal weight;
turning off all the redundant capacitors and then performing analog-to-digital (A/D) conversion to obtain a first output sequence code of the code reestablishment circuit;
calculating a first DNL sequence of the analog-to-digital converter according to the first output sequence code;
extracting actual weights of effective capacitors according to the first DNL sequence;
turning off the effective capacitors corresponding to all the redundant capacitors and then performing A/D conversion to obtain a second output sequence code of the code reestablishment circuit;
calculating a second DNL sequence of the analog-to-digital converter according to the second output sequence code; and
extracting actual weights of the redundant capacitors according to the second DNL sequence.

11. The DNL-based performance improvement method according to claim 10, wherein the setting a capacitor weight initial value in the weight storage circuit as an ideal weight specifically comprises:
setting a significant bit weight, with a $j^{th}$ significant bit weight $W_j = 2^{j-1}$, wherein $j = 1, 2, \ldots, n$; and
setting a redundant bit weight, with a $k^{th}$ redundant bit weight $W'_k = W_k = 2^{k-1}$, wherein $k = 1, 2, \ldots, r$.

12. The DNL-based performance improvement method according to claim 10, wherein the extracting actual weights of effective capacitors according to the first DNL sequence specifically comprises the following steps:
restoring according to the first DNL sequence to obtain an input output relation of the analog-to-digital converter as follows:

$$A_{in}(x) = \sum_{j=1}^{x} A(j) = x + \sum_{j=1}^{x} DNL(j),$$

wherein $A_{in}(x)$ is an analog input voltage increment corresponding to a digital code x;
extracting a weight of an $n^{th}$ effective capacitor as follows:

$$W_n = \frac{1}{2^{n-1} - 2 \times N_e(n)} \left[ \sum_{j=2^{n-1}+N_e(n)}^{2^n-N_e(n)} A_{in}(j) - \sum_{j=N_e(n)}^{2^{n-1}-N_e(n)} A_{in}(j) \right],$$

wherein $N_e(n)$ is a number of rejection points determined by a process mismatch; assuming a maximum mismatch determined by a process variation is e %, $N_e(n)$ is a rounded product of $2^n * e$ % in the calculation of an $n^{th}$ bit of capacitor weight, i.e. $N_e(n) = \text{int}(2^n \times e \%)$;
extracting a weight $W_{n-1}$ of an $(n-1)^{th}$ bit of effective capacitor as follows:

$$W_{(n-1)_1} = \frac{1}{2^{n-2} - 2 \times N_e(n-1)} \left[ \sum_{j=2^{n-2}+N_e(n-1)}^{2^{n-1}-N_e(n-1)} A_{in}(j) - \sum_{j=N_e(n-1)}^{2^{n-2}-N_e(n-1)} A_{in}(j) \right]$$

$$W_{(n-1)_2} = \frac{1}{2^{n-2} - 2 \times N_e(n-1)} \left[ \sum_{j=2^{n-2}+N_e(n-1)+2^{n-1}}^{2^{n-1}-N_e(n-1)+2^{n-1}} A_{in}(j) - \sum_{j=N_e(n-1)+2^{n-1}}^{2^{n-2}-N_e(n-1)+2^{n-1}} A_{in}(j) \right]$$

$$W_{(n-1)} = \frac{1}{2}[W_{(n-1)_1} + W_{(n-1)_2}],$$

wherein $N_e(n-1) = \text{int}(2^{n-1} \times e \%)$;
extracting a weight $W_m$ of an $m^{th}$ bit of effective capacitor as follows:

$$W_{m_1} = \frac{1}{2^{m-1} - 2 \times N_e(m)} \left[ \sum_{j=2^{m-1}+N_e(m)}^{2^m-N_e(m)} A_{in}(j) - \sum_{j=N_e(m)}^{2^{m-1}-N_e(m)} A_{in}(j) \right]$$

$$W_{m_2} = \frac{1}{2^{m-1} - 2 \times N_e(m)} \left[ \sum_{j=2^{m-1}+N_e(m)+2^m}^{2^m-N_e(m)+2^m} A_{in}(j) - \sum_{j=N_e(m)+2^m}^{2^{m-1}-N_e(m)+2^m} A_{in}(j) \right]$$

$$\ldots$$

$$W_{m_{(2^{n-m})}} = \frac{1}{2^{m-1} - 2 \times N_e(m)} \left[ \sum_{j=2^{m-1}+N_e(m)+(2^{n-m}-1)\times 2^m}^{2^m-N_e(m)+(2^{n-m}-1)\times 2^m} A_{in}(j) - \sum_{j=N_e(m)+(2^{n-m}-1)\times 2^m}^{2^{m-1}-N_e(m)+(2^{n-m}-1)\times 2^m} A_{in}(j) \right]$$

$$W_m = \frac{1}{2^{n-m}} \sum_{j=1}^{2^{n-m}} W_{mj};$$

repeating as such to extract all capacitor weights remained after the $m^{th}$ capacitor;
if the capacitor weights of the capacitors after the $m^{th}$ capacitor as determined by the process variation have no effect on the monotonicity of the capacitor array, a mismatch error of a capacitor with the weight of less than $W_m$ is negligible, and the weight of the capacitor is an ideal weight.

13. The DNL-based performance improvement method according to claim 10, wherein the extracting actual weights of redundant capacitors according to the second DNL sequence specifically comprises the following steps:

restoring according to the second DNL sequence to obtain an input output relation of the analog-to-digital converter as follows:

$$A'_{in}(x) = \sum_{j=1}^{x} A'(j) = x + \sum_{j=1}^{x} DNL'(j),$$

wherein $A'_{in}(x)$ is an analog input voltage increment corresponding to a digital code x;

extracting a weight $W_{r'}$ of an $r'^{th}$ redundant capacitor as follows:

$$W_{r'_1} = \frac{1}{2^{r-1} - 2 \times N_e(r')} \left[ \sum_{j=2^{r-1}+N_e(r')}^{2^r - N_e(r')} A_{in}(j) - \sum_{j=N_e(r')}^{2^{r-1} - N_e(r')} A_{in}(j) \right]$$

$$W_{r'_2} = \frac{1}{2^{r-1} - 2 \times N_e(r')} \left[ \sum_{j=2^{r-1}+N_e(r')+2^{r'}}^{2^r - N_e(r')+2^{r'}} A_{in}(j) - \sum_{j=N_e(r')+2^{r'}}^{2^{r-1} - N_e(r')+2^{r'}} A_{in}(j) \right]$$

...

$$W_{r'(2^{n-r'})} = \frac{1}{2^{r'-1} - 2 \times N_e(r')} \left[ \sum_{j=2^{r'-1}+N_e(r')+(2^{n-r'}-1)\times 2^{r'}}^{2^{r'} - N_e(r')+(2^{n-r'}-1)\times 2^{r'}} A_{in}(j) - \right.$$

$$\left. \sum_{j=N_e(r')+(2^{n-r'}-1)\times 2^{r'}}^{2^{r'-1} - N_e(r')+(2^{n-r'}-1)\times 2^{r'}} A_{in}(j) \right]$$

$$W_{r'} = \frac{1}{2^{n-r'}} \sum_{j=1}^{2^{n-r'}} W_{r'_j};$$

repeating as such to extract all capacitor weights remained after the $r'^{th}$ capacitor;

if the capacitor weights of the capacitors after the $m^{th}$ capacitor as determined by the process variation have no effect on the monotonicity of the capacitor array, a mismatch error of a capacitor with the weight of less than $W_{m'}$ is negligible, and the weight of the capacitor is an ideal weight.

14. The DNL-based performance improvement method according to claim 10, wherein the method further comprises the following steps:

writing the extracted actual weight into the weight storage circuit;

turning on all the effective capacitors and redundant capacitors to enable the same to participate in the A/D conversion; and performing the A/D conversion and obtaining a correct output code by using the actual weights.

* * * * *